United States Patent
El Gemayel et al.

(10) Patent No.: US 10,872,096 B1
(45) Date of Patent: Dec. 22, 2020

(54) INTERCHANGE DATA FORMAT SYSTEM AND METHOD

(71) Applicants: Charbel Gerges El Gemayel, Amchit Blybos (LB); Adib Khalil Haddad, Tilal Ain Saadeh (LB); Edgard Joseph Elian, Savage, MN (US)

(72) Inventors: Charbel Gerges El Gemayel, Amchit Blybos (LB); Adib Khalil Haddad, Tilal Ain Saadeh (LB); Edgard Joseph Elian, Savage, MN (US)

(73) Assignees: Charbel Gerges El Gemayel, Amchit Blybos (LB); Adib Kahlil Haddad, Tilal Ain Saadeh (LB); Edgar Joseph Elian, Savage, MN (US)

( * ) Notice: Subject to any disclaimer, the term of this patent is extended or adjusted under 35 U.S.C. 154(b) by 0 days.

(21) Appl. No.: 16/778,184

(22) Filed: Jan. 31, 2020

Related U.S. Application Data (63) Continuation of application No. 16/666,340, filed on Oct. 28, 2019.

(51) Int. Cl.
*G06F 16/00* (2019.01)
*G06F 16/25* (2019.01)
*G06F 16/22* (2019.01)

(52) U.S. Cl.
CPC ........ *G06F 16/258* (2019.01); *G06F 16/2246* (2019.01)

(58) Field of Classification Search
CPC .......................... G06F 16/258; G06F 16/2246
See application file for complete search history.

(56) References Cited

U.S. PATENT DOCUMENTS

| | | | | |
|---|---|---|---|---|
| 6,055,526 A * | 4/2000 | Ambroziak | ........... | G06F 16/328 707/693 |
| 6,532,012 B2 * | 3/2003 | Deering | .................. | G06T 9/001 345/423 |
| 6,848,078 B1 * | 1/2005 | Birsan | .................... | G06F 16/904 715/206 |
| 7,191,405 B1 * | 3/2007 | Jaramillo | .................. | G06F 8/33 715/201 |
| 9,026,903 B1 * | 5/2015 | Michael | .................. | G06F 40/14 715/235 |
| 10,044,522 B1 * | 8/2018 | Shamis | ............... | H04L 41/0816 |
| 2002/0073119 A1 * | 6/2002 | Richard | ................ | G06F 16/957 715/239 |
| 2002/0085035 A1 * | 7/2002 | Orbanes | ................ | G06F 3/0481 715/764 |
| 2002/0111964 A1 * | 8/2002 | Chen | ..................... | G06F 16/258 715/205 |
| 2003/0066033 A1 * | 4/2003 | Direen, Jr. | .............. | G06F 16/84 715/255 |
| 2003/0088829 A1 * | 5/2003 | Itani | ........................ | G06F 40/14 715/255 |

(Continued)

*Primary Examiner* — Leslie Wong
(74) *Attorney, Agent, or Firm* — Brett A. Schenck (57) ABSTRACT

A computer-implemented method for electronic exchange of data is provided. The method includes the following operations performed by at least one computer processor. These operations include creating source data, identifying data structure from the source data, generating a header file based on the data structure, localizing identical data structure, and storing groups of data that have identical structure in a single data tag.

20 Claims, 7 Drawing Sheets

(56) References Cited

U.S. PATENT DOCUMENTS

| | | | |
|---|---|---|---|
| 2004/0003343 A1* | 1/2004 | Liao | H03M 7/30 |
| | | | 715/242 |
| 2004/0107356 A1* | 6/2004 | Shamoon | H04L 63/0428 |
| | | | 713/193 |
| 2006/0182138 A1* | 8/2006 | Kamiya | G06F 40/14 |
| | | | 370/452 |
| 2007/0260476 A1* | 11/2007 | Smolen | G06F 16/2308 |
| | | | 705/1.1 |
| 2008/0127120 A1* | 5/2008 | Kosche | G06F 11/3447 |
| | | | 717/131 |
| 2010/0011013 A1* | 1/2010 | Singh | G06F 16/258 |
| | | | 707/E17.006 |
| 2018/0314722 A1* | 11/2018 | Li | G06F 16/81 |
| 2019/0370254 A1* | 12/2019 | Maxwell | G16B 50/30 |

\* cited by examiner

INTERCHANGE DATA FORMAT SYSTEM AND METHOD

FIELD

This application relates to a system and method generally in the field of data interchange, and more particularly a new interchange data format system and method that can be parsed, validated and transformed to and from any existing kind of data.

BACKGROUND

Data exchange has long been an issue in information technology. The electronic data interchange (EDI) supports the electronic exchange of standard documents and is currently the major data format for electronic commerce. To transfer data over the network, many formats are possible like JSON, XML, CSV, GPB, YAML and others. An observation of previous interchanged language format reveals a very poor storage optimization Hence, it is at least one object of the present invention to improve the electronic exchange of standard documents.

SUMMARY

In one aspect of the present invention, a computer-implemented method for electronic exchange of data is provided. The method includes the following operations performed by at least one computer processor. These operations include creating source data, identifying data structure from the source data, generating a header file based on the data structure, localizing identical data structure, and storing groups of data that have identical structure in a single data tag.

In another aspect of the present invention, non-transitory computer-readable medium storing computer-executable instructions that, when executed by at least one processor, cause the at least one processor to perform a method for electronic exchange of data is provided. The method includes creating source data, identifying data structure from the source data, generating a header file based on the data structure, localizing identical data structure, and storing groups of data that have identical structure in a single data tag.

Further embodiments of the disclosed interchange data format system and method will become apparent from the following detailed description, the accompanying drawings and the appended claims.

DETAILED DESCRIPTION

It will be readily understood that the components of the embodiments as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

As used herein, the terms "component" and "system" are intended to encompass hardware, software, or a combination of hardware and software. Thus, for example, a system or component may be a process, a process executing on a processor. Additionally, a component or system may be localized on a single device or distributed across several devices.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, etc. In other instances, well-known structures, materials, or operations are not shown or described in detail to avoid obfuscation. The following description is intended only by way of example, and simply illustrates certain example embodiments.

The present invention improves the storage optimization of the interchanged language format mentioned above by eliminating the redundancy of the structure of data by using indices. In particular, the data structure and data are separated such that the data structure is written only once while the data is optimally mapped to indices instead of being wrapped by redundant tags like other language cases. In essence, a new message format is created that can be implemented for inter-connect system communication and can be used in computer system that can serialize and convert messages to usable application data or objects.

The new message format is also known as Indexed Data Object Language (IDOL). IDOL is by nature a compression language for data storage or data transfer that can be applied and converted to and from any kind of data. The general form of the format of the present invention is composed from header and details, wherein the header has a structure as: <index type: tag_name/>, where index is the index or position of the tag, type is the data type it stores (string by default) and tag_name represents the mapped tag name.

The following instructions are respected in this format
(i) The root has the index 0.
(ii) Every set of sibling tags have consecutive indices numbering starting from 1.
(iii) Attributes are represented by the keyword "att" at the end of the tag's index.

The raw data is also mapped in such an optimal way to create the indexed structure. This is accomplished by detecting and determining the data structure that is being redundant. After detecting the repeating tags and determining the initial parent tag of these repeating tags, the next step is to count the number of times that these data are being repeated and mapping them to the index of the initial parent tag.

The general form of each data tag will be: <index-number_of_records: {" . . . ", " . . . ", . . . }, {" . . . ", " . . . ", . . . }, . . . />, where index is the index of the initial parent tag, number_of_records is the number of times N these data are being repeated, and following that are N bracketed set of data of the form: {"$data_1$", "$data_2$", . . . , "$data_m$" }, where m is the count of all tags included in the initial parent tag plus the number of attributes.

The grammar for this language is defined as G=<Σ, N, Axiom, P> where

Σ denotes the alphabet of characters supported by this language

N={Struct, Position, PositionSubsequent, Type, Data, Datum, DatumSubsequent, List, ListSubsequent, Index, IndexSubsequent} the set of non terminals Axiom P is the following set of productions:
$P_0$: Axiom→<head> Struct </head> Data
$P_1$: Struct→<Position:Type:id/> Struct
$P_2$: Struct→ε
$P_3$: Position→nb PositionSubsequent
$P_4$: PositionSubsequent→:nb PositionSubsequent
$P_5$: PositionSubsequent→:att:nb
$P_6$: PositionSubsequent→ε
$P_{7,8,9}$: Type→string|int |float
$P_{10}$: Data→<Index-nb:Datum/> Data
$P_{11}$: Data→ε
$P_{12}$: Datum→{List} DatumSubsequent
$P_{13}$: DatumSubsequent→, {List} DatumSubsequent
$P_{14}$: DatumSubsequent→ε
$P_{15}$: List→str ListSubsequent
$P_{16}$: ListSubsequent→, str ListSubsequent
$P_{17}$: ListSubsequent→ε
$P_{18}$: Index→nb IndexSubsequent
$P_{19}$: IndexSubsequent→:nb IndexSubsequent
$P_{20}$: IndexSubsequent→ε

Note: "id" is an identifier composed of alphabets and numbers, but starting with an alphabet, "nb" is a number and "str" is a string of characters starting and ending with double quotes. All attributes belonging to the same tag are numbered in order to preserve order.

The Axiom is the starting point for any input string in our model, which will call the non-terminal Struct, wrapped between a <head> tag, and the non-terminal Data. Struct represents the structure tags in our model, calling the general structure of those tags, starting with the Position (a series of numbers separated by a colon, and can end with an attribute using the keyword att), followed by the Type (string, int or float) and an id, which is in fact the name of the represented data. Finally that is followed by another Struct, until we reach the end of the structure tags, and Struct→ε is called.

Examples of structure tags are as follows:
<0:string:table/>
<0:4:5:1:string:Address/>
<1:2:att:string:ID/> (case of zero or one attribute supported per tag)
<1:2:att:1:string:ID/> (case of zero or n attributes supported per tag)

Data represents the data tags in the present invention, calling the general structure of those tags, starting with the Index (a series of numbers separated by a colon), followed by the number of occurrences of this data tag, and then calling the non-terminal Datum. Finally that is followed by another Data, until we reach the end of the data tags, and Data-E is called. Datum represents a series of Lists (vectors of string separated by commas), each wrapped between curly brackets and separated by commas.

An example of a data tag is as follows:
<0:1:1-4:{"0","Charbel","0344"},{"1","Eddy","2372" },{"2","Adib","6568" },{"3","Gemayel","4502" }/>

Figure 1:
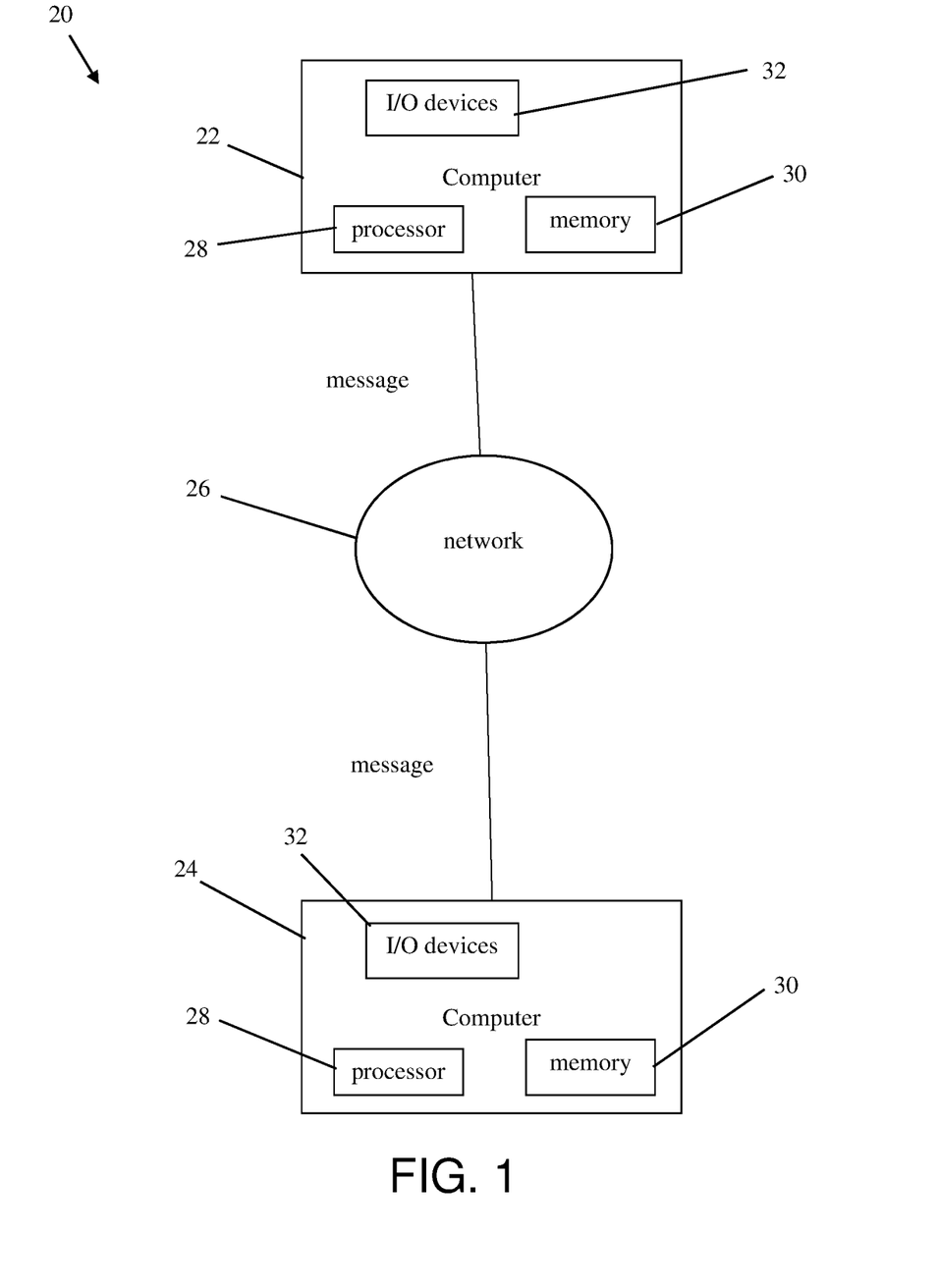
FIG. 1 is a block diagram of one embodiment of the interchange data format system according to the present invention.

FIG. 1 shows a block diagram of one embodiment of the interchange data format system 20. The system 20 comprises a client server system for performing client-server message exchanges. The system may include computers 22, 24 that may process a request and return data. The computer may communicate with the server system 20 via the internet over a network 26. The network 26 may include any one or combination of multiple different types of networks, such as cable networks, local area networks, personal area networks, wide area networks, the Internet, wireless networks, ad hoc networks, mesh networks, and/or the like. Each computer may include one or more processors 28, a memory 30, and input/output devices 32. The computers 22, 24 may send a messages to each other over the network. Other types of interchange data format system may be utilized. The computers 22, 24 can serialize and convert messages to a usable application With reference now to FIGS. 2 and 3, an example methodology is illustrated and described in which the system applies an interchange format language based on indexing that works as compression language for data storage or transfer that can be applied and converted to and from any kind of data. While the methodology is described as being a series of acts or steps that are performed in a sequence, it is to be understood that the methodology is not limited by the order of the sequence. For instance, some acts or steps may occur in a different order than what is described herein. In addition, a step may occur concurrently with another step. Furthermore, in some instances, not all steps may be required to implement a methodology described herein.

Moreover, the steps or acts described herein may be computer-executable instructions that can be implemented by one or more processors and/or stored on a computer-readable medium or media. The computer-executable instructions may include a routine, a sub-routine, programs, a thread of execution, and/or the like. Still further, results of acts of the methodology may be stored in a computer-readable medium, displayed on a display device, and/or the like.

Figure 2:
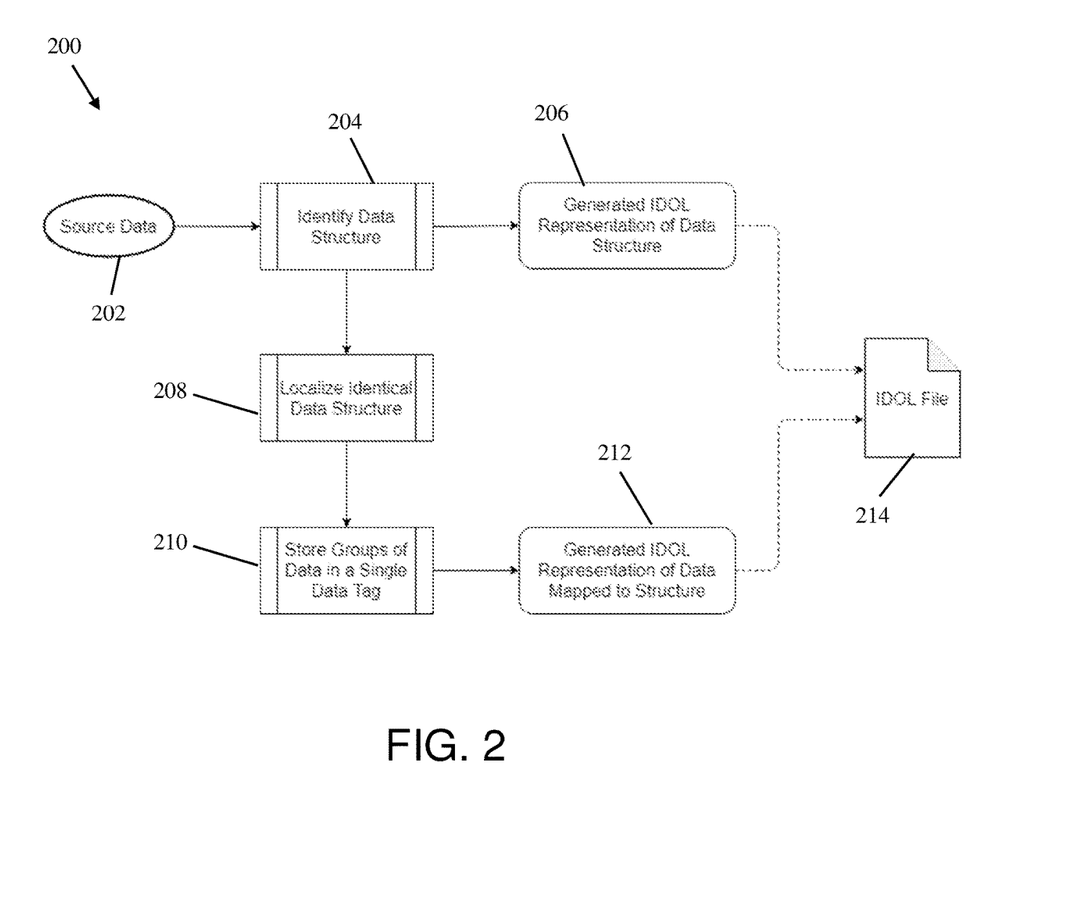
FIG. 2 is a flow diagram of a portion of an exemplary method according to the system of FIG. 1.

In each step of this sequence of client-server message exchanges, a computer may process a request and return data. FIG. 2 illustrates a method 200 having operational steps for transforming data to idol format language. The method illustrates how any data file csv, json, xml . . . can be converted into Idol format. The main tasks are detecting data structure and generating a unique header file (IDOL representation of data structure). Once a header is generated all the data tags are generated with the header property indexes so that the property names are omitted. Merging the head tag and the data tags will result in the final IDOL document. In particular, the method starts with the source data being created in step 202. In step 204, the data structure is identified from the source data. In step 206, a unique header file is generated which is the IDOL representation of the data structure. In step 208, identical data structure is then localize. Then, in step 210 groups of data are stored in a single data tag. In step 212, IDOL representation of Data is mapped to structure based on the data tag. Then, the head tag and data tags are merged to create the final IDOL document in step 214.

The following example illustrates the steps and operations done in FIG. 2. A database table named inventors has three columns (ID, Fullname, Address) filled with the following Data:

| ID | Fullname | Address |
|----|----------|---------|
| 1 | Charbel El Gemayel | Beirut |
| 2 | Edgard Elan | USA |
| 3 | Adib Haddad | Achrafieh |

The source data is the table of inventors. The data structure is identified from the source data by the three columns, their types and the filled data in this table. A unique header file is generated by representing the structure "once" via indices.

The general form of each structure tag would be:
<index: type: tag_name/>,
where index is the index of the tag, type is the data type it stores (string by default) and tag_name represents the mapped tag name.

For this example, the unique header file would be:
<head>
<0:string:table/>
<0:1:string:Inventors/>
<0:1:1:int:ID/>
<0:1:2:string:fullname/>
<0:1:3:string:Address/>
</head>

The next step is the mapping of the raw data in such an optimal way to the created structure. Such source data would be parsed into XML. For example, it would be the following: XML representation:
<table>
  <Inventors>
    <ID>1</ID>
    <fullname>Charbel El Gemayel</fullname>
    <Address>Beirut</Address>
  </Inventors>
  <Inventors>
    <ID>2</ID>
    <fullname>Edgard Elian</fullname>
    <Address>USA</Address>
  </Inventors>
  <Inventors>
    <ID>3</ID>
    <fullname>Adib Haddad</fullname>
    <Address>Achrafieh</Address>
  </Inventors>
  <Inventors>
</table>

Alternatively, the source data could be parsed into JSON. For example, it would have the following JSON representation:
[
  {
    "ID": "1",
    "Fullname": "Charbel El Gemayel",
    "Address": "Beirut"
  },
  {
    "ID": "2",
    "Fullname": "Edgard Elian",
    "Address": "USA"
  },
  {
    "ID": "3",
    "Fullname": "Adib Haddad",
    "Address": "Achrafieh"
  }
]

Referring to the XML representation, the redundancy of the data structure (indicated in bold face) for each record in the table of the Inventors is clearly seen. After accomplishing this step and creating an indexing structure for the data structure, it is now possible to group all data with similar structure (in this example data that are records from the same table), and map them to the appropriate index in the already created indexing structure in the <head></head> tag. Identical data structure is thus localized and then stored in a single data tag. For this example, the repeated data structure is "Inventors→ID, fullname, Address". So, pointed out is the parent index that is repeated, which in this case is the tag "Inventors" with index 0:1. It should be noted that ID with index 0:1:1 is a child of Inventors with index 0:1. So, by referencing the tag with a given index, it is implicitly referred to along with its children.

The general form of each structure tag would be:
<index-number_of_redundancy: {" . . . ", " . . . ", . . . }, {" . . . ", " . . . ", . . . }, . . . />,
where index is the index of the initial parent tag, number_of_redundancy is the number of times N these data are being repeated, and following that are N bracketed set of data of the form: {"$data_1$", "$data_2$", . . . , "$data_m$"}, where m is the count of all tags included in the initial parent tag.

The data tag for this example would be:
<0:1-3:{" ","1", "Charbel El Gemayel","Beirut" },{" ","2", "Edgard Elian","USA" },{" ","3","Adib Haddad", "Achrafieh" }/>
where the number "3" represents the number of data records inside the data tag.

Finally, the head tag and the data tags are merged to create the final IDOL document.

Figure 3:
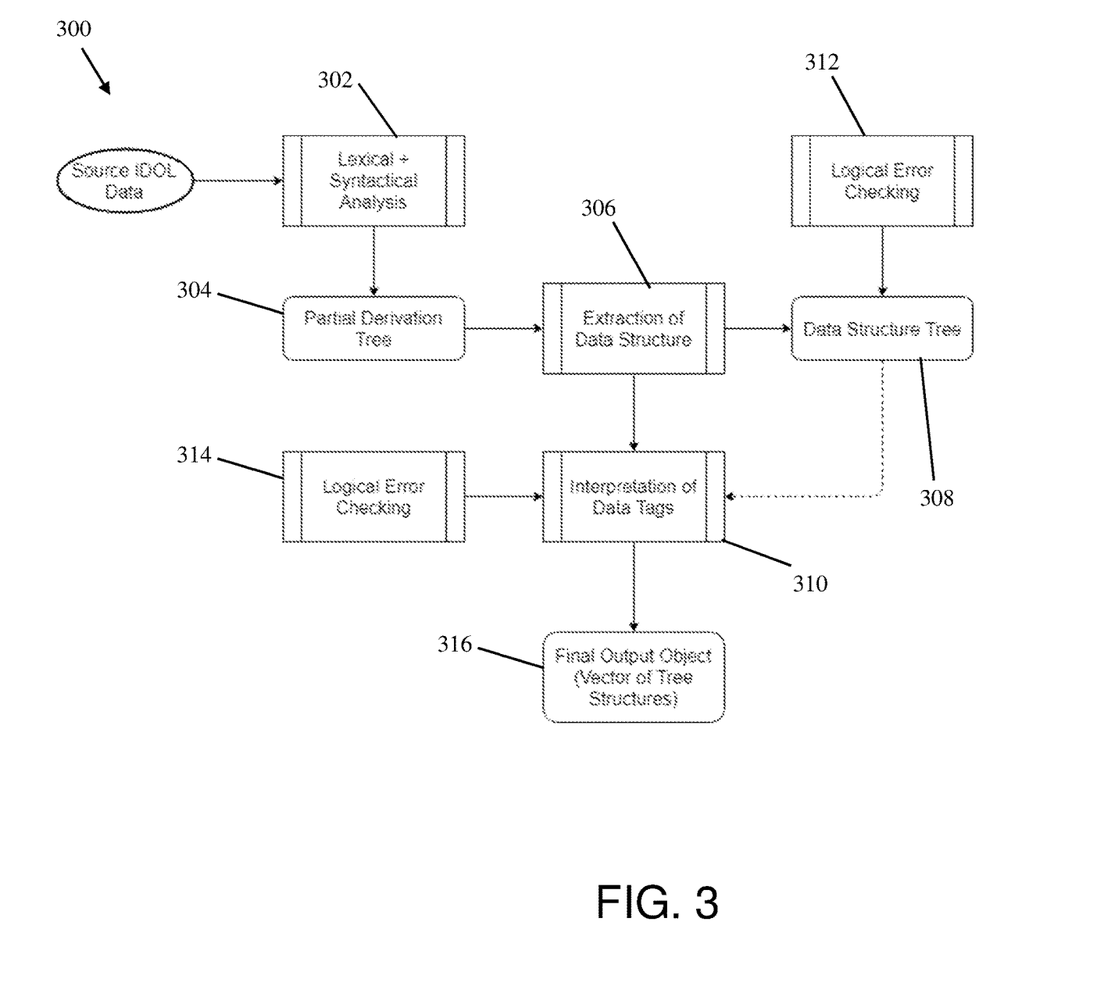
FIG. 3 is a flow diagram of another portion of the exemplary method according to the system of FIG. 1.

FIG. 3 illustrates a method as to how IDOL data in the final IDOL document is validated, parsed and transformed to a data Object. In general, the first step is validating the document content and generating a data structure tree. Once the tree is generated, each data tag is parsed and mapped to the data structure tree in order to build a final data Tree containing all data with the appropriate data structures generated at each data branch. Specifically, in step 302, a lexical syntactical analysis is performed to validate the document. Then, in step 304, a partial derivation tree is created. Then, in step 306, the data structure is extracted. In step 308, a data structure tree is also generated from the extracted data. Then, the data tags extracted from the data structure and also data structure tree are interpreted in step 310. Logical error is checked at the data structure tree and interpretation of data tags in steps 312 and 314, respectively. Then, in step 316, the final tree is created from data tags. This step 316 involves parsing each data node and mapping the data to the tree in order to have one final tree containing the structure and all data linked to it. The data tree contains all data with the appropriate data structures generated at each data branch.

These steps are illustrated below with them being performed on the final IDOL document example created by the steps of FIG. 2. The parsing is accomplished by the following four steps on the bold face portion of the data structure in this example.

First, the Lexical+Syntactical Error Checking is performed the as illustrated below:

<head>
<0:string:table/>
<0:1:string:Inventors/>
<0:1:1:int:ID/>
<0:1:2:string:fullname/>
<0:1:3:string:Address/>
</head>
<0:1-3:{" ","1","Charbel El Gemayel","Beirut" }, {" ","2","Edgard Elian","USA" },{" ","3","Adib Haddad", "Achrafieh" }/>

Examples of Lexical Errors:
"<hed>" instead of "<head>"
"<0-1-1:int:ID/>" instead of "<0:1:1:int:ID/>"
The absence of "</head>"

Examples of Syntactical Errors:
Having a structure tag outside the <head> tag
"<int:0:1:1:ID/>" instead of "<0:1:1:int:ID/>"
The absence of the number of occurrences in the data tags.

Second, the Logical Error Checking is performed as illustrated below:

<head>
<0:string:table/>
<0:1:string:Inventors/>
<0:1:1:int:ID/>
<0:1:2:string:fullname/>
<0:1:3:string:Address/>
</head>
<0:1-3:{" ","1","Charbel El Gemayel","Beirut" }, {" ","2","Edgard Elian","USA" },{" ","3","Adib Haddad", "Achrafieh" }/>

This step can be split into two sub steps:
i) Structure Tags Indexes Logical Checking: Check the correctness of the index of each structure tag in accordance to the others. Examples of such errors:
  a. The presence of 0:2:1 without the presence of 0:2.
  b. The presence of 0:2 without the presence of 0:1
ii) Data Tags Logical Checking: Check whether the mapped index exists in the structure tags, and assert the indicated number of data records inside the tag, with the actual count of tags record. Examples of such errors:
  a. <0:1-5:{ } . . . /> without the presence of a structure tag with the index 0:1.
  b. <0:1-3:{" . . . "," . . . " }, {" . . . "," . . . " }/>, here it is stated that there are 3 data records, however only two are declared inside the tag.

Third, the Generation of the Data Structure Tree is performed as illustrated below:

<head>
<0:string:table/>
<0:1:string:Inventors/>
<0:1:1:int:ID/>
<0:1:2:string:fullname/>
<0:1:3:string:Address/>
</head>
<0:1-3:{" ","1","Charbel El Gemayel","Beirut"}, {" ","2","Edgard Elian","USA" },{" ","3","Adib Haddad", "Achrafieh" }/>

Figure 4:
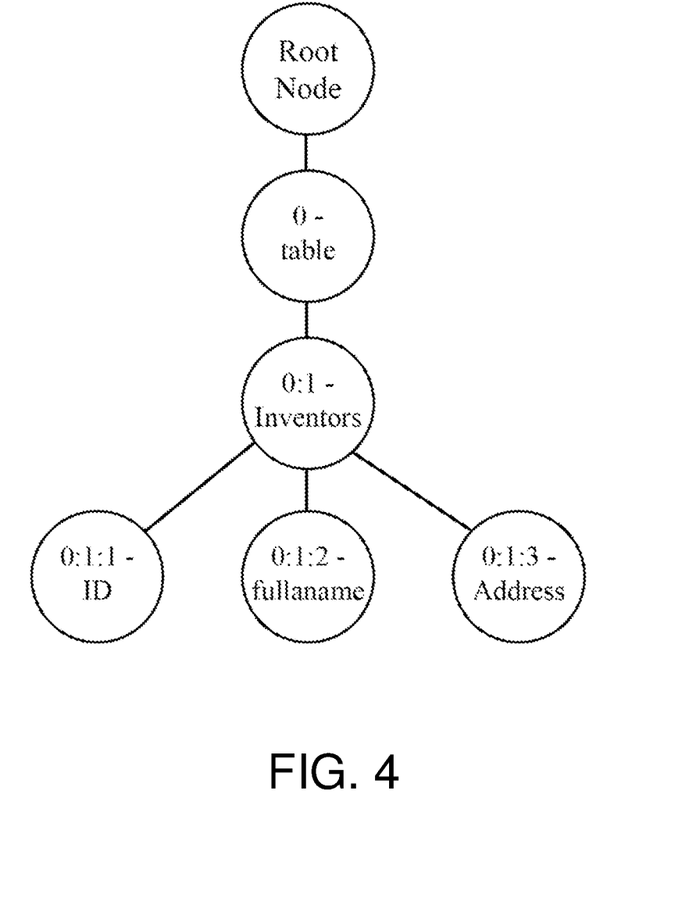
FIG. 4 is a data tree structure created according to the exemplary method of the present invention.

This third step only extracts information from the <head> tag (i.e., the tag containing the data structure information). The goal is to create a "model" structure tree that will be the basis for the next and final step of raw data parsing. For this example, the data structure tree would look like that shown in FIG. 4.

Figure 5:
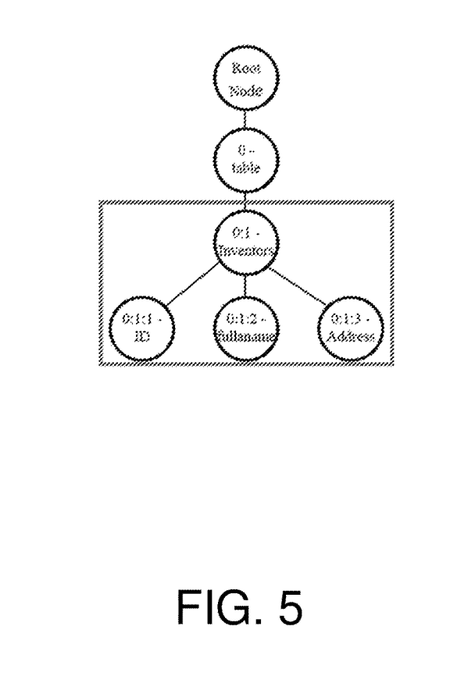
FIG. 5 is the data tree structure of FIG. 4 with a box marked around a portion of the data tree structure for illustrative purposes.
Figure 6:
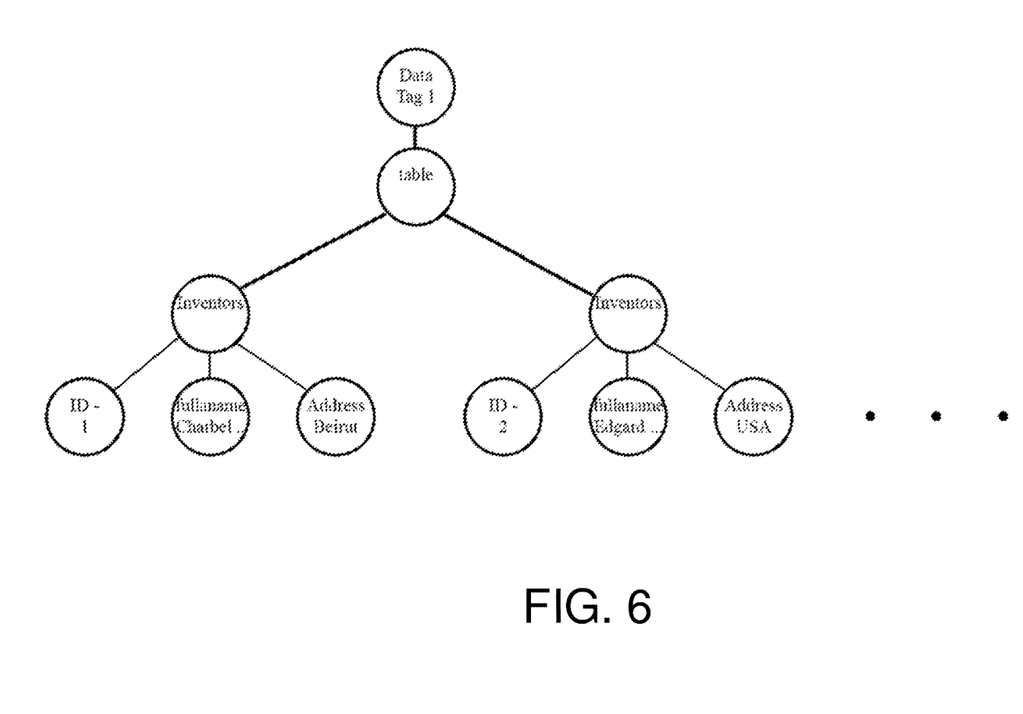
FIG. 6 is a data object tree created according to the exemplary method of the present invention.

Fourth, the Generation of the Final Data Object Tree is performed as described below. In this step, each data tag is parsed independently. First, the reference index is localized inside the data tag inside our data structure tree. Then, for every data record, the data structure defined in the data structure tree is replicated and added to the final data object tree. In this example, the index "0:1" is localized in the tree. After doing so, the structure of the data records to come is now known. So, for each of the following data records enclosed by the box marked in FIG. 5, the first data value is assigned to the index "0:1", the second data value is assigned to the index "0:1:1", the third data value is assigned to the index for "0:1:2" and the fourth data value is assigned to the index "0:1:3". The resulting data object tree is shown in FIG. 6.

So instead of repeating the field names repeatedly, the data is simply mapped to a simple index. As illustrated, IDOL provides the capability to display data and supports data type and file size lighter. The IDOL is compatible with other format languages as any language can be converted to it.

When working with large data, this language will show a main advantage comparing to others in that the file size will be less. Taking the same table inventors (3 columns) and filling it with some data (566570 rows), the file size using idol format is ~21 MB, and in xml is ~53 MB. (X=2.5)

Taking another table composed of 128 columns and containing ~50000 rows, the file size is ~28 MB. By contrast, xml and json have a file size of ~127 MB. (X=4.5) using this table.

The following is a basic example of an xml file with attribute to idol:
XML with attribute
<table>
  <record attribute="1">
  <field1>a</field1>
  <field2>b</field2>
  <field3>c</field3>
  </record>
  <record attribute="2">
  <field1>A</field1>
  <field2>B</field2>
  <field3>C</field3>
  </record>
</table>
IDOL
<head>
<0:string:table/>
<0:1:string:record/>
<0:1:att:string:attribute/>
<0:1:1:string:field1/>
<0:1:2:string:field2/>
<0:1:3:string:field3/>
</head>
<0:1-2: {"1", " ", "a", "b", "c" }, {"2", " ", "A", "B", "C" }/>

Figure 7:
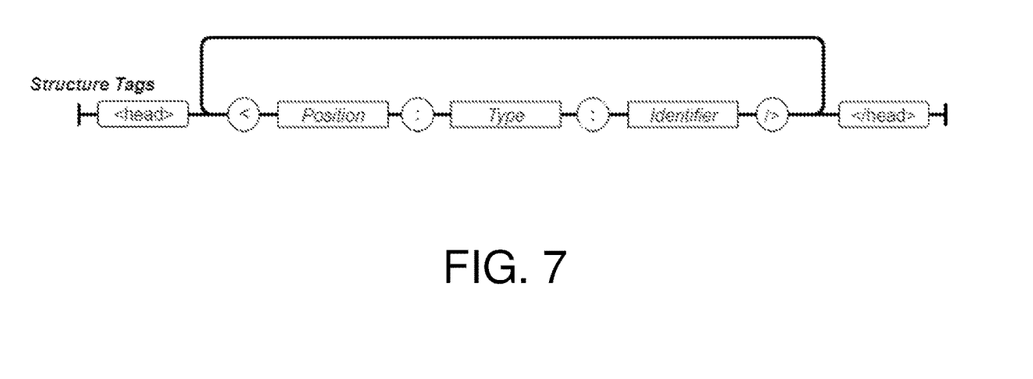
FIG. 7 illustrates a data presentation of the present invention showing the structure tag format.

FIGS. 7-11 illustrate the data representation. In particular, FIG. 7 shows the structure tag format. This tag is present only once per each Idol data document. It starts and ends with the head tag. Within this tag, the type and index and name of each property are listed. Each property tag can have nested tags within data depending on the data format.

Figure 8:
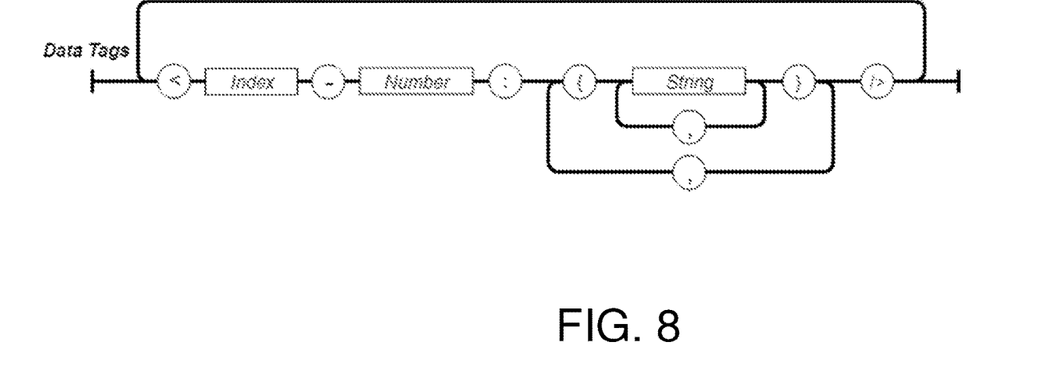
FIG. 8 illustrates a data presentation of the present invention showing the general format of a data tag.
Figure 9:
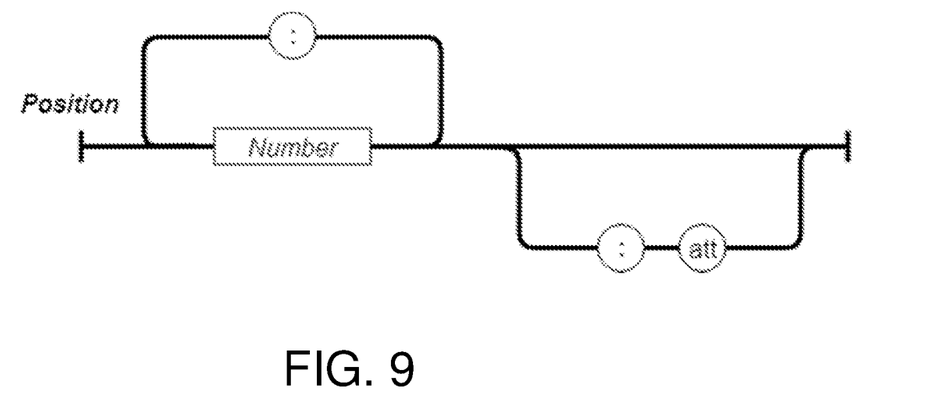
FIG. 9 illustrates a data presentation of the present invention showing the composition of the position in the structure tag.
Figure 10:
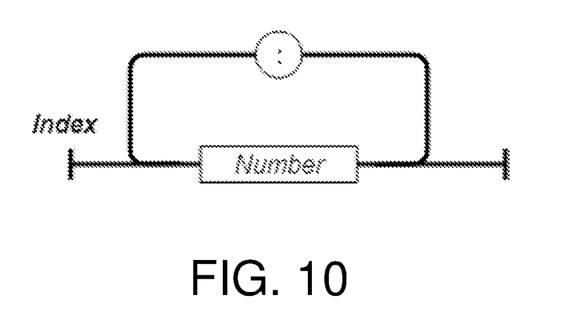
FIG. 10 illustrates a data presentation of the present invention showing the composition of the index in the data tag.
Figure 11:
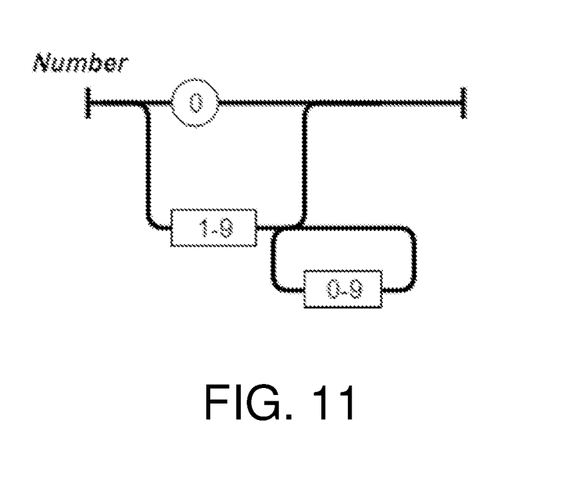
FIG. 11 illustrates a data presentation of the present invention showing the composition of the number in the data tag.

FIG. 8 shows the general format of a data tag. Each tag starts with the index that links it to a header tag. After the – symbol, there is the number of records within this tag to eliminate the need of tag count. Next, there is an object containing simple data or other objects, and arrays of objects. There is no need to add the objects properties names because they are defined in the header, each property position/index is mapped to the ones in the header. FIG. 9 shows the composition of the Position in the structure tag. FIG. 10 shows the composition of the index in the data tag. FIG. 11 shows the composition of the Number in the data tag.

The present invention eliminates redundancy in the data structure via the use of indices by separating structure and data. The structure is written only once, while data is (optimally) mapped to indices instead of wrapped by redundant tags like other language cases. The new message format that is created is implemented for inter-connect system communication and can be used in computer system that can serialize and convert messages to usable application data or objects.

Although various embodiments of the disclosed interchange data format system and method have been shown and described, modifications may occur to those skilled in the art upon reading the specification. The present application includes such modifications and is limited only by the scope of the claims.

What is claimed is:

1. A computer-implemented method for electronic exchange of data, the method comprising the following operations performed by at least one computer processor:
   a) creating source data;
   b) identifying data structure from the source data;
   c) generating a header file based on the data structure;
   d) localizing identical property names in the data structure;
   e) removing redundant property names in the data structure; and
   f) storing groups of data that have identical structure in a single data tag in the header file,
   wherein a format of each data tag includes an index of an initial parent tag and number of times the data having the identical data structure is repeated, wherein the format of each data tag omits the property names.

2. The computer-implemented method of claim 1, wherein localizing identical data structure includes creating an indexing structure for the data structure and mapping identical data structure to a corresponding index in the indexing structure.

3. The computer-implemented method of claim 1, further including transforming the data to a data object subsequent to storing groups of data that have identical structure in a single data tag.

4. The computer-implemented method of claim 1, further comprising:
   g) subsequent to storing groups of data that have identical structure in a single data tag, validating the data in the single data tag;
   h) parsing the data in each of the single data tags; and
   i) transforming the data to a data object.

5. The computer-implemented method of claim 4, wherein validating the data in the single data tag includes performing a lexical syntactical analysis.

6. The computer-implemented method of claim 1, further comprising:
   g) subsequent to storing groups of data that have identical structure in a single data tag, validating the data in each of the single data tags;
   h) generating a first data structure tree from the data in each of the single data tags;
   i) parsing and mapping the data tags to the data structure tree; and
   j) creating a second data structure tree based on the data tags.

7. The computer-implemented method of claim 1, further comprising:
   g) mapping IDOL representation of data to structure based on the data tag; and
   h) merging a head tag of the header file and each of the data tags to create an IDOL document.

8. The computer-implemented method of claim 7, further including transforming the data to a data object subsequent to storing groups of data that have identical structure in a single data tag.

9. The computer-implemented method of claim 7, further comprising:
   i) subsequent to creating the IDOL document, validating the data in each of the single data tags;
   j) generating a first data structure tree;
   k) parsing and mapping the data tags to the data structure tree; and
   l) creating a second data structure tree based on the data tags.

10. The computer-implemented method of claim 1, further comprising:
   g) validating IDOL data in the final IDOL document by performing a lexical syntactical analysis;
   h) generating a partial derivation tree based on the IDOL document;
   i) extracting data structure from the IDOL document;
   j) generating a first data structure tree from the extracted data structure;
   k) interpreting data tags extracted from the data structure and the first data structure tree;
   l) parsing and mapping the data tags to the first data structure tree; and
   m) creating a second data structure tree based on the parsed and mapped data tags of the first data structure tree.

11. The computer-implemented method of claim 7, further comprising performing logical error checking at the step of interpreting the data structure and at the step of generating the data structure tree.

12. The computer-implemented method of claim 1, wherein the header file is an IDOL representation of the data structure.

13. The computer-implemented method of claim 1, wherein generating the header file based on the data structure is performed by representing the data structure once via indices.

14. The computer-implemented method of claim 1 further comprising generating data tags with header property indexes such that the property names are omitted.

15. A non-transitory computer-readable medium storing computer-executable instructions that, when executed by at least one processor, cause the at least one processor to perform a method for electronic exchange of data, the method comprising:

a) creating source data;
b) identifying data structure from the source data;
c) generating a header file based on the data structure;
d) localizing identical property names in the data structure;
e) removing redundant property names in the data structure; and
f) storing groups of data that have identical structure in a single data tag in the header file,
wherein a format of each data tag includes an index of an initial parent tag and number of times the data having the identical data structure is repeated, wherein the format of each data tag omits the property names.

16. The non-transitory computer-readable medium of claim 15, further comprising:

g) mapping IDOL representation of data to structure based on the data tag; and
h) merging a head tag of the header file and data tags to create an IDOL document.

17. The non-transitory computer-readable medium of claim 16, further comprising:

i) subsequent to creating the IDOL document, validating the data in each of the single data tags;
j) generating a first data structure tree;
k) parsing and mapping the data tags to the data structure tree; and
l) creating a second data structure tree based on the data tags.

18. The non-transitory computer-readable medium of claim 15, further comprising generating data tags with header property indexes such that the property names are omitted.

19. The non-transitory computer-readable medium of claim 15, wherein localizing identical data structure includes creating an indexing structure for the data structure and mapping identical data structure to a corresponding index in the indexing structure.

20. A non-transitory computer-readable medium storing computer-executable instructions that, when executed by at least one processor, cause the at least one processor to perform a method for electronic exchange of data, the method comprising:

a) creating source data;
b) identifying data structure from the source data;
c) generating a header file based on the data structure;
d) localizing identical data structure;
e) storing groups of data that have identical structure in a single data tag;
f) validating IDOL data in the final IDOL document by performing a lexical syntactical analysis;
g) generating a partial derivation tree based on the IDOL document;
h) extracting data structure from the IDOL document;
i) generating a first data structure tree from the extracted data structure;
j) interpreting data tags extracted from the data structure and the first data structure tree;
k) parsing and mapping the data tags to the first data structure tree; and
l) creating a second data structure tree based on the parsed and mapped data tags of the first data structure tree.

* * * * *